United States Patent
Wang et al.

(10) Patent No.: US 9,864,155 B2
(45) Date of Patent: Jan. 9, 2018

(54) OPTICAL COMPONENT

(71) Applicants: Hisense Broadband MultiMedia Technologies Co., Ltd, Qingdao, Shandong (CN); Hisense USA Corp., Suwanee, GA (US); Hisense International Co., Ltd., Qingdao, Shandong (CN)

(72) Inventors: Hao Wang, Shandong (CN); Hongwei Mu, Shandong (CN); YongLiang Huang, Shandong (CN); Shun Zhang, Shandong (CN)

(73) Assignees: Hisense Broadband Multimedia Technologies Co,. Ltd., Qingdao (CN); Hisense USA Corp., Suwanee, GA (US); Hisense International Co., Ltd., Qingdao (CN)

( * ) Notice: Subject to any disclaimer, the term of this patent is extended or adjusted under 35 U.S.C. 154(b) by 113 days.

(21) Appl. No.: 14/849,362

(22) Filed: Sep. 9, 2015

(65) Prior Publication Data
US 2017/0068059 A1 Mar. 9, 2017
US 2017/0307838 A9 Oct. 26, 2017

(30) Foreign Application Priority Data

Mar. 30, 2015 (CN) .......................... 2015 1 0145276

(51) Int. Cl.
G02B 6/36 (2006.01)
G02B 6/42 (2006.01)
H01P 3/08 (2006.01)

(52) U.S. Cl.
CPC ......... *G02B 6/4279* (2013.01); *G02B 6/4278* (2013.01); *H01P 3/081* (2013.01)

(58) Field of Classification Search
CPC ............................ G02B 6/4278; G02B 6/4279
See application file for complete search history.

(56) References Cited

U.S. PATENT DOCUMENTS 4,922,325 A 5/1990 Smeltz, Jr.
5,875,204 A 2/1999 Sato
(Continued)

FOREIGN PATENT DOCUMENTS

CN 1501482 A 6/2004
CN 1812697 A 8/2006
(Continued)

OTHER PUBLICATIONS

First Chinese Office Action to Chinese Application No. 201510145276.3 dated Feb. 20, 2017 along with English Translation, (12p).
(Continued)

*Primary Examiner* — Rhonda Peace
(74) *Attorney, Agent, or Firm* — Brinks Gilson & Lione (57) ABSTRACT

An optical component includes: a first substrate, a second substrate, and a transfer board. A first electrically conductive path is disposed on a top surface of the first substrate. A second electrically conductive path is disposed on a bottom surface of the first substrate. A third electrically conductive path is disposed on a top surface of the second substrate. A microstrip line structure is disposed on the transfer board. The microstrip line structure includes a transfer line disposed on a top surface of the transfer board. The top surface of the second substrate is opposite to the bottom surface of the first substrate, where the second electrically conductive path fits the third electrically conductive path. The transfer board is disposed on the top of the top surface of the second
(Continued)

substrate. One end of the transfer line is electrically connected to the first electrically conductive path by a wire bonding.

20 Claims, 9 Drawing Sheets

(56) References Cited

U.S. PATENT DOCUMENTS

| | | | |
|---|---|---|---|
| 6,774,748 B1 | 8/2004 | Ito et al. | |
| 7,751,458 B2 | 7/2010 | Regaard et al. | |
| 8,981,864 B2* | 3/2015 | Gerlach | H05K 1/024 333/1 |
| 9,335,022 B2 | 5/2016 | Lee | |
| 9,413,131 B1 | 8/2016 | Wang et al. | |
| 2003/0128552 A1 | 7/2003 | Takagi et al. | |
| 2003/0214031 A1 | 11/2003 | Onoue | |
| 2004/0021217 A1 | 2/2004 | Epitaux et al. | |
| 2004/0264882 A1* | 12/2004 | Torigoe | G02B 6/4201 385/88 |
| 2005/0214957 A1 | 9/2005 | Kihara et al. | |
| 2008/0271915 A1* | 11/2008 | Wang | H05K 1/0219 174/266 |
| 2009/0010652 A1 | 1/2009 | Iwafuji | |
| 2009/0029570 A1* | 1/2009 | Ikeuchi | H01P 1/047 439/67 |
| 2009/0243115 A1 | 10/2009 | Lee et al. | |
| 2010/0096166 A1* | 4/2010 | Fjelstad | H05K 1/189 174/254 |
| 2011/0048796 A1 | 3/2011 | Tsujino | |
| 2011/0294308 A1* | 12/2011 | Kuwata | H01R 12/62 439/55 |
| 2011/0298568 A1 | 12/2011 | Uchimura et al. | |
| 2012/0087136 A1* | 4/2012 | Kuwahara | G02B 6/4272 362/362 |
| 2012/0235764 A1* | 9/2012 | Kang | H01P 3/006 333/26 |
| 2013/0051413 A1 | 2/2013 | Chen et al. | |
| 2013/0265734 A1* | 10/2013 | Herbsommer | G02B 6/12004 361/783 |
| 2016/0086005 A1* | 3/2016 | Hattori | A47F 10/02 340/10.51 |
| 2016/0294156 A1* | 10/2016 | Wang | H01S 5/02236 |

FOREIGN PATENT DOCUMENTS

| | | |
|---|---|---|
| CN | 1866650 A | 11/2006 |
| CN | 1902763 A | 1/2007 |
| CN | 101246266 A | 8/2008 |
| CN | 101794929 A | 8/2010 |
| CN | 102393863 A | 3/2012 |
| CN | 103762400 A | 4/2014 |
| JP | 2001251009 A | 9/2001 |

OTHER PUBLICATIONS

Xing, "*Numerical Calculation and Simulation Analysis of Electromagnetic Field*",Jun. 30, 2014, p. 154, Published by National Defense Industry Press, Beijing, China. Along with Concise Explanation of the book page in English, (9p).

Fikar, Stefan, et al., "*A 100GHz Bandwidth Matched Chip to PCB Transition Using Bond Wires for Broadband Matching*,"Published in Signal Propagation on Interconnects, SPI 2008, 12th IEEE Workshop, May 12-15, 2008, http://ieeexplore.ieee.org/document/ 4558360/, (11p).

Sakai, Kiyohide, et al., "*1.3-μm Uncooled DFB Laser-Diode Module With a Coupled Differential Feed for 10-Gb/s Ethernet Applications*,"Journal of Lightwave Technology, vol. 22, No. 2, Feb. 2004, pp. 574-581, http://ieeexplore.ieee.org/document/ 1278501/, (23p).

First Chinese Office Action dated May 9, 2017 to Chinese Application No. 201510145308.X, and English Translation, (12p).

* cited by examiner

OPTICAL COMPONENT

CROSS-REFERENCE TO RELATED APPLICATION

This application claims priority to Chinese Patent Application No. 201510145276.3, filed on Mar. 30, 2015, which is hereby incorporated by reference in its entirety.

TECHNICAL FIELD

The present disclosure relates to the optical communications field, and in particular, to an optical component.

BACKGROUND

Optical modules and optical components of the optical communications field develop very quickly. With a large number of fiber to the home (FTTH) and 3G/4G network construction in China, the demands on optical modules and optical components are increasing. Therefore, optical modules and optical components characterized by high development speed, long transmission distance, miniaturization, and low power consumption become the focus of device suppliers and component suppliers.

In order to adapt to miniaturization tendency of optical components, encapsulated laser and other electronic components are usually used as an optical component, and a printed circuit board (PCB) outside is connected to the laser and the other electronic components encapsulated inside, so as to supply electric energy to the laser and the other electronic components. Because the PCB supplies electric energy to the laser and the other components through an electrically conductive path between the PCB and the laser and other components, an impedance matching design of each electrically conductive path has a great influence on a high-frequency signal input to the laser.

SUMMARY

An embodiment of the present disclosure provides an optical component, which may meet an impedance matching requirement of high-frequency signal transmission.

An optical component is provided, which comprises a first substrate, a second substrate, and a transfer board; a first electrically conductive path is disposed on a top surface of the first substrate, and a second electrically conductive path is disposed on a bottom surface of the first substrate; a third electrically conductive path is disposed on a top surface of the second substrate; a microstrip line structure is disposed on the transfer board, wherein the microstrip line structure comprises a transfer line disposed on a top surface of the transfer board; the top surface of the second substrate is opposite to the bottom surface of the first substrate, wherein the second electrically conductive path fits the third electrically conductive path, and the transfer board is disposed on the top of the top surface of the second substrate; and one end of the transfer line is electrically connected to the first electrically conductive path by a wire bonding.

An optical device is also provided, which comprises a fiber adapter connected to an optical component comprising: a first substrate comprising a first top surface and a first bottom surface; a second substrate comprising a second top surface and a second bottom surface, and a transfer board comprising a top transfer surface and a bottom transfer surface; wherein a first electrically conductive path is disposed on the first top surface, and a second electrically conductive path is disposed on the first bottom surface. wherein a third electrically conductive path is disposed on the second top surface; wherein a microstrip line structure is disposed on the transfer board; the microstrip line structure comprises a transfer line disposed on the top transfer surface; wherein the second top surface is opposite to the first bottom surface; wherein the second electrically conductive path fits the third electrically conductive path; and wherein the transfer board is disposed on the top of the second top surface and located in the third electrically conductive path.

BRIEF DESCRIPTION OF THE DRAWINGS

To illustrate the technical solutions in the embodiments of the present disclosure more clearly, the following briefly introduces the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

REFERENCE NUMERAL fiber adapter—101;
cavity—102;
pin—103 and 104;
laser—105;
anode of the laser—105*a*;
heat sink—106;
first microstrip line structure—200;
first substrate—201;
second substrate—202;
transfer board—203;
first electrically conductive path—204 (204*a*, 204*b*, 204*c*, 204*d*, 204*e*, 204*f*, and 204*g*)
second electrically conductive path—205;
third electrically conductive path—206;
transfer line—207 (207*a*, 207*b*, 207*c*, 207*d*, 207*e*, 207*f*, and 207*g*);
microstrip line structure on the transfer board—300;
first electrically conductive layer—301;
via hole—302 and 304;
second electrically conductive layer—303; and
second microstrip line structure—400.

DETAILED DESCRIPTION

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. section 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue.

The following clearly and completely describes the technical solutions in the embodiments of the present disclosure with reference to the accompanying drawings in the embodiments of the present disclosure. Apparently, the described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

In the description of the present disclosure, it should be understand that positions and positional relationships indicated by the terms such as "center", "above", "below", "in front of", "behind", "left", "right", "vertical", "horizontal", "top", "bottom", "inside", "outside" are based on the position or positional relationship shown in the accompany drawings, which are used only for convenient and brief description, and do not indicate or imply that the indicated apparatus or element must be in a specific position, and must be constructed and operated in a specific position. In addition, in embodiments of the present disclosure, an inner end and an outer end are both defined according to directions of signals in a transmission path, that is, according to directions of signals in a transmission path, one end for inputting signals is defined as the outer end or a signal input end of the transmission path, and another end for outputting signals is defined as the inner end or a signal output end. Of course, other names may be defined according to principles, and thus the foregoing cannot be understood as a limitation on the present disclosure.

With quick development of optical modules and optical components in the optical communications field, system carries are increasingly demanding on optical modules and optical components. Specific manifestations are as follows: transmission speed is increased from 1.25 G, 2.5 G, 10 G, 40 G to 100 G or higher; a transmission distance is increased from 2 km, 10 km, 40 km to 80 km or farther; for miniaturization, an optical module is evolved from a gigabit interface converter (GBIC), a 10 Gigabit EtherNet Transceiver PAcKage (XENPAK), an X2 (a 10 G optical module evolved from the XENPAK), a 10 Gigabit Small Form Factor Pluggable (XFP) to a small form-factor pluggable (SFP+); and correspondingly, an optical component is evolved from butterfly to a 10 Gbit/s Miniature Device (XMD). An optical component according to the embodiments of the present disclosure is an optical component using an XMD encapsulation manner. Of course, the optical component according to the embodiments of the present disclosure is not limited to the optical component using the XMD encapsulation manner.

Figure 1:
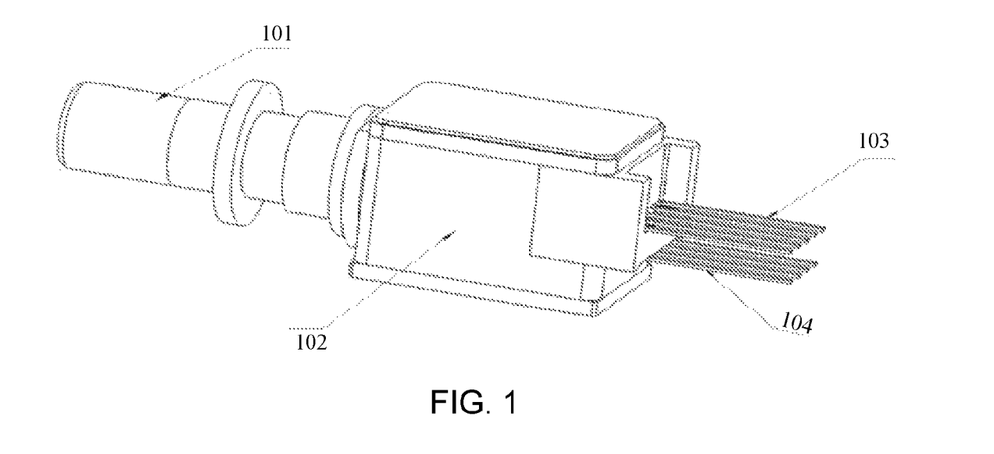
FIG. 1 is an external structural diagram of an optical component according to the prior art.

As shown in FIG. 1, an encapsulation structure of an optical component according to an embodiment of the present disclosure usually includes a fiber adapter 101, a cavity 102, a laser and other elements encapsulated in the cavity (not shown in FIG. 1). Light from the laser enters a fiber through the fiber adapter 101, and a printed circuit board (PCB) used to supply electric energy is connected to the optical component using pins (103 and 104), so that the optical component is fasten and electric energy is supplied to the laser and other elements.

Figure 2:
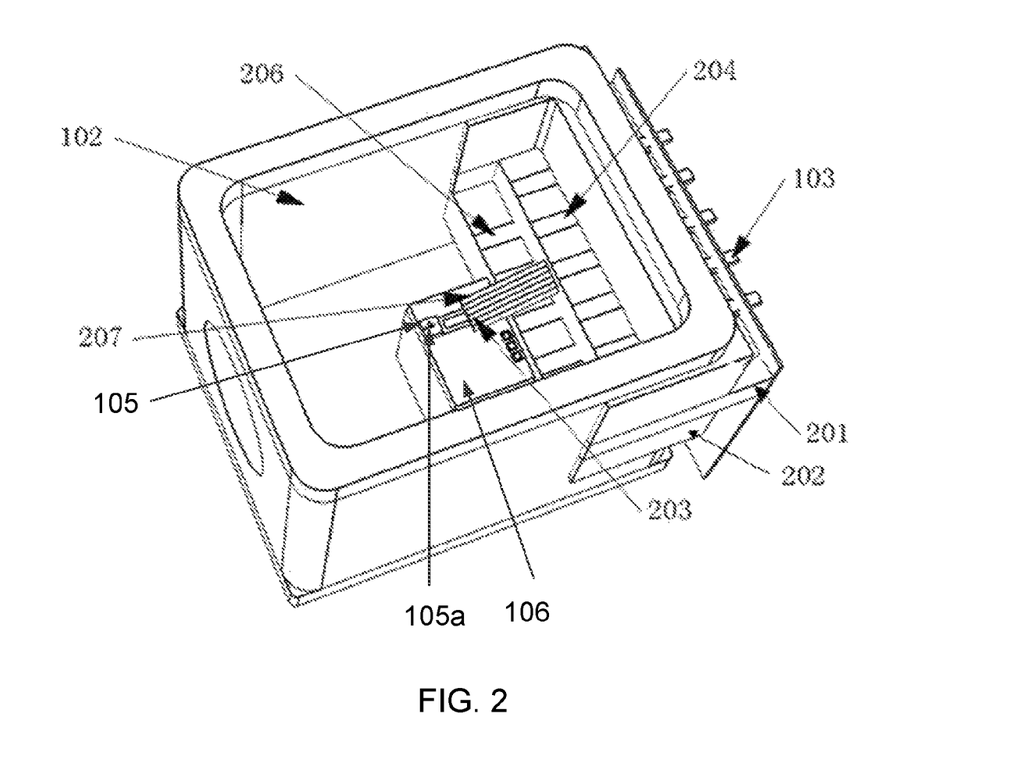
FIG. 2 is an internal structural diagram of an optical component according to an embodiment of the present disclosure.
Figure 3:
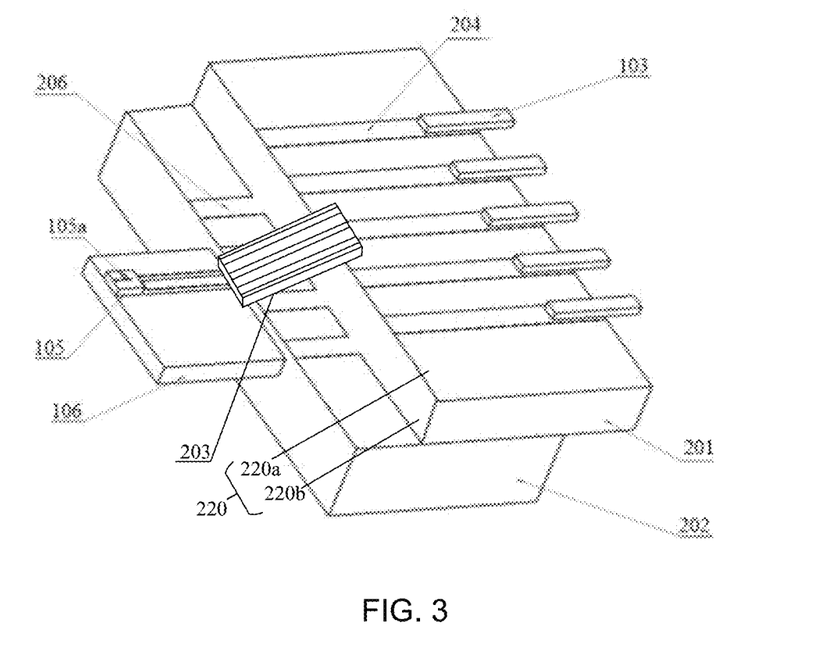
FIG. 3 is local structural diagram 1 of the optical component shown in FIG. 2 according to an embodiment of the present disclosure.
Figure 4:
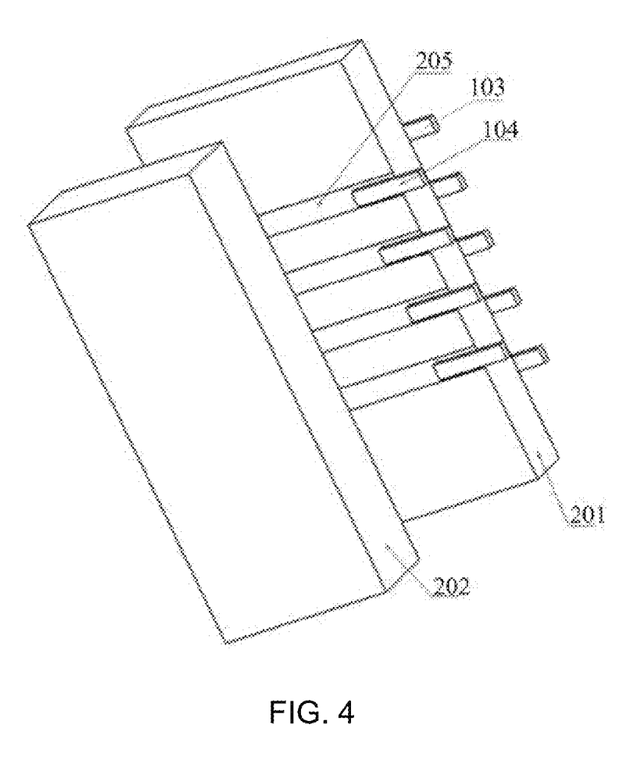
FIG. 4 is local structural diagram 2 of the optical component shown in FIG. 2 according to an embodiment of the present disclosure.

The laser and other elements inside the optical component are electrically connected to the pins (103 and 104) by using a transfer component in the cavity 102. For details, see FIG. 2, FIG. 3, FIG. 4, FIG. 5, FIG. 6, and FIG. 7. A first substrate 201 is disposed in the cavity 102. As shown in FIG. 3 and FIG. 4, a first electrically conductive path 204 is disposed on a top surface of the first substrate 201, a pin 103 is disposed at an outer end of the first electrically conductive path 204, and an inner end of the first electrically conductive path 204 is connected to an element inside the cavity 102 by using wire bonding.

Figure 7:
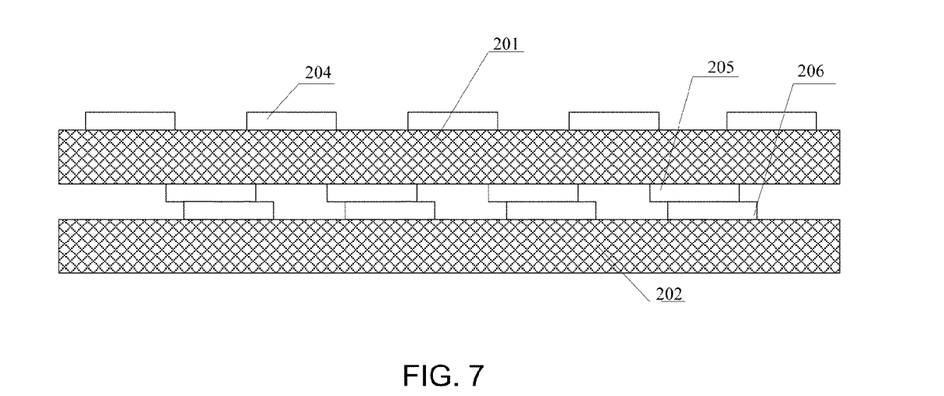
FIG. 7 is a cross-section structural diagram of a first substrate and a second substrate of the optical component shown in FIG. 2 according to an embodiment of the present disclosure.

Because many elements inside the optical component require electric energy supply, multiple first electrically conductive path 204 need to be disposed on the top surface of the first substrate 201. To ensure enough separation distance between each electrically conductive path, multiple electrically conductive paths disposed on the same surface of the same substrate occupy a large width, which affects overall width of the optical component and does not benefit miniaturization of the optical component. Therefore, a second electrically conductive path 205 is disposed on a bottom surface of the first substrate 201, and a pin 104 is disposed at an outer end of the second electrically conductive path 205. However, because wire bonding can be implemented on only one side of the substrate, a second substrate 202 is disposed in the cavity 102, and a third electrically conductive path 206 is disposed on a top surface of the second substrate 202. As shown in FIG. 3, FIG. 4, and FIG. 7, the top surface of the second substrate 202 is opposite to the bottom surface of the first substrate 201, where the second electrically conductive path 205 fits the third electrically conductive path 206, and an inner end of the third electrically conductive path 206 may be connected to the element of the cavity 102 by using the wire bonding. Specifically, an inner end of each second electrically conductive path 205 fits an outer end of a third electrically conductive path 206., and because a signal outputting end of each third electrically conductive path is electrically connected to the elements encapsulated in the optical component, the inner end of the third electrically conductive path needs to be exposed to one side of the first substrate; however, the pin 104 needs to be disposed at the outer end of the second electrically conductive path 205, and thus an outer end of each second electrically conductive path 205 is exposed to one side of the second substrate 202.

Figure 6:
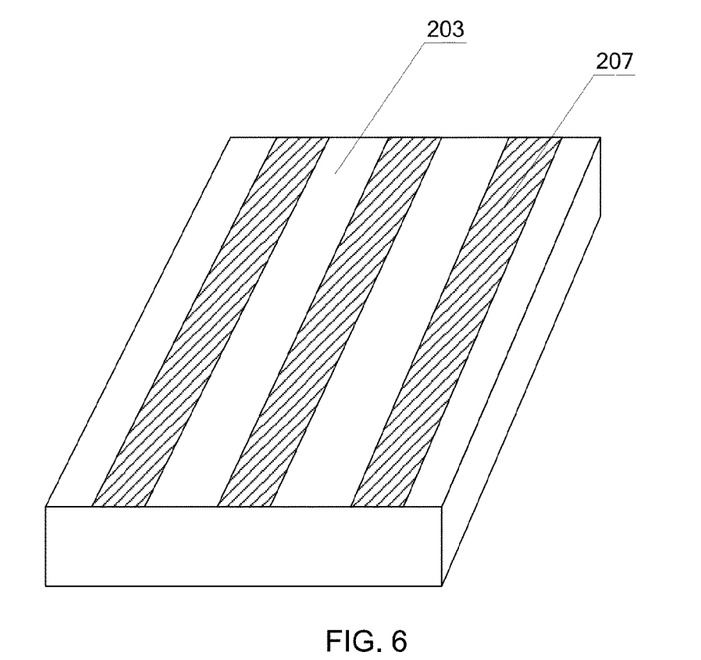
FIG. 6 is a structural diagram of a transfer board of the optical component shown in FIG. 2 according to an embodiment of the present disclosure.

Because the second electrically conductive path 205 is fitly electrically connected to the third electrically conductive path 206, which results in low alignment accuracy and cannot ensure impedance matching of the electrically conductive path, they are usually used for transmitting direct current signals. The first electrically conductive path 204 is used for transmitting high frequency signals of the laser. However, the inner end of the third electrically conductive path 206 needs to be exposed to one side of the first substrate, so a wire bonding distance between the first electrically conductive path 204 and a connected element is increased; in addition, shapes and status of wire bonding makes it render an inductance characteristic, which results in impedance mismatching of a signal transmitting channel. To solve the problem of impedance mismatching between a transmission path and a high frequency signal due to too long wire bonding length, a transfer board 203 is disposed in the cavity 102. As shown in FIG. 6, a microstrip line structure is disposed on the transfer board 203, and the microstrip line structure on the transfer board 203 includes a transfer line 207 on a top surface of the transfer board 203. Here, the microstrip may include an electrical transmission line which is fabricated using printed circuit board technology. The microstrip may be used to convey microwave-frequency signals. As shown in FIG. 2, FIG. 3, and FIG. 4, one end of the transfer line 207 is electrically connected to the first electrically conductive path 204 by using the wire bonding, another end of the transfer line 207 is connected to an internal element of the optical component by using the wire bonding, and a pin 204 inputs a high frequency signal to the laser of the optical component through the first electrically conductive path 204 and the transfer line 207. The transfer line included in the microstrip line structure on the transfer board 203 makes a characteristic impedance of the transmitted frequency signal controllable, which solves the problem of impedance mismatching between the transmission path and the high frequency signal due to too long wire bonding length.

The forgoing provided optical component includes the first substrate, the second substrate, and the transfer board. To meet a requirement that the wire bonding can be implemented only on one side of the substrate, all electrically conductive paths requiring the wire bonding: the first electrically conductive path, the third electrically conductive path, and the transfer line are all disposed on one side of a carrier substrate. The third electrically conductive path fits the second electrically conductive path to implement transfer connection. An signal outputting end of each third electrically conductive path is electrically connected to an element encapsulated in the optical component by using the wire bonding; therefore, the signal outputting end of the third electrically conductive path is exposed to one side of the first substrate, so the wire bonding distance between the first electrically conductive path and the connected element is increased, and thus the transfer board is disposed on the top of the top surface of the second substrate and located in the third electrically conductive path, so that the connection between the first electrically conductive path and the element is transferred by using the transfer line on the transfer board. Because the microstrip line structure is disposed on the transfer board, and the microstrip line structure on the transfer board includes the transfer line disposed on the top surface of the transfer board, and the microstrip line structure makes a characteristic impedance of the high frequency signal transmitted in the transfer line controllable. Therefore, in embodiments of the present disclosure, the transfer line and the first eclectically conductive path are set to meet a preset impedance matching requirement, which means that wire bonding length between the first electrically conductive path and the connected element is shorted, so that impedance mismatching between the transmission path and the high frequency signal due to too long wire bonding length is avoided, and thus the impedance matching requirement for high frequency signal transmission is met.

Figure 8:
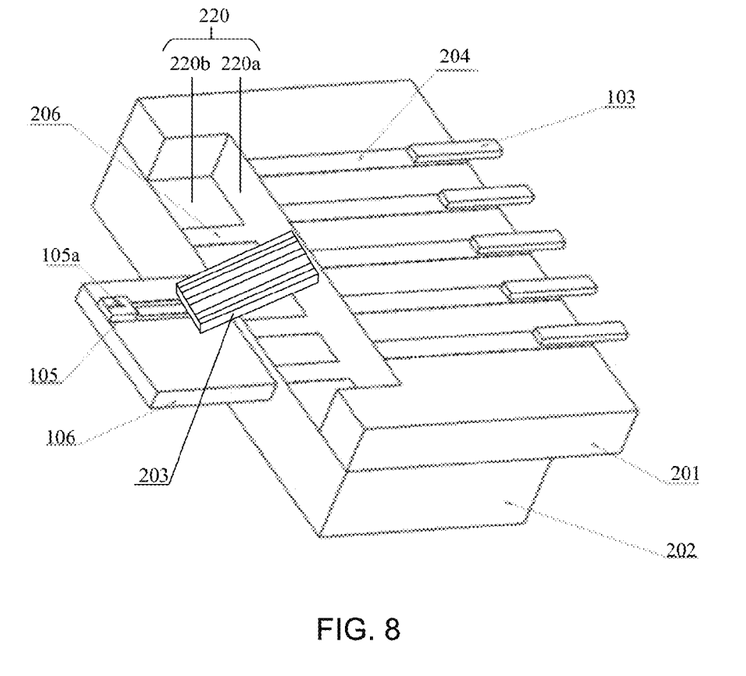
FIG. 8 is a local structural diagram of the optical component shown in FIG. 2 according to another embodiment of the present disclosure.

As shown in FIG. 2, the first substrate 201 and the second substrate 202 are installed at one end of the cavity 102 of the optical component, while in FIG. 3, edges of two ends of the electrically conductive path on the first substrate 201 are all flush structures, so a stepped notch 220 is formed at a junction location of the first substrate 201, the second substrate 202, and the cavity 102. The notch 220 may include two side surfaces 220*a* and 220*b* as shown in FIGS. 3 and 8. As a result, it is difficult to completely seal the cavity 102 during an encapsulation process. In order to completely seal the cavity 102 during the encapsulation process, as shown in FIG. 8, the first substrate 201 includes a notch 220 thereon, and projecting edges of two sides of the notch 220 are aligned with the second substrate 202. The transfer board 203 is at least partially disposed in the notch 220. Referring to the foregoing structure, the inner end of each third electrically conductive path 206 is exposed to the notch 220, and the projecting edges of the two sides of the notch 220 on the first substrate are aligned with the second substrate 202, so that the cavity 102 is completely sealed by utilizing the projecting edges of the two sides of the notch 220.

In addition, FIG. 2 uses laser encapsulation as an example. FIG. 2 further shows a laser 105 and a heat sink 106. A cathode of the laser 105 fits an electrically conductive layer of a surface of the heat sink. An anode 105a of the laser is disposed on a top surface of the laser 105.

Other electrical components are attached on a top surface of the heat sink, for example, a thermistor, a monitor photodiode (MPD), a TEC, and the like. For ease of gold wire bonding, wire bonding height is minimized, and the top surface of the heat sink 106 and the top surface of the second substrate 202 are in the same plane or near the same plane.

In addition, an element similar to the laser needs to be driven by a high frequency signal; however, a path for transmitting the high frequency signal needs to meet the required impedance matching requirement, so as to ensure that the high frequency signal can transmit a point of load completely (such as an anode 105a of the laser shown in FIG. 2), and would not be reflected in the transmission path. Therefore, quality of the high frequency signal is improved. As shown in FIG. 7, one end of each second electrically conductive path 205 fits one end of the third electrically conductive path 206; however, with a limitation of craft precision, there is no guarantee that the second electrically conductive path 205 and the third electrically conductive path 206 are completely right fit, and when the second electrically conductive path 205 and the third electrically conductive path 206 are not completely right fit, the impedance of the transmission line cannot be guaranteed. Therefore, providing a high frequency signal to the anode 105a of the laser through the first electrically conductive path 204 on the top surface of the first substrate 201 is prioritized. However, if the electrically conductive path 204 is electrically connected to the anode 105a of the laser by using a gold wire, the high frequency signal needs to be transmitted to the anode 105a of the laser through the gold wire of a considerable length. In addition, shapes and status of the gold wire makes it render an inductance characteristic, which results in discontinuous impedance of the signal transmitting path, and transmission bandwidth is seriously limited. Therefore, in embodiments of the present disclosure, the first electrically conductive path 204 is connected to the anode 105a of the laser by using the transfer line 207 on the transfer board 203. In addition, in order to minimize the diameter of the transmission path between the first electrically conductive path 204 and the laser 105, the transfer board 203 is at least partially disposed in the notch of the first substrate 201, so that the first electrically conductive path 204 is approximately linear connected to the anode 105a of the laser. In addition, wire bonding using gold wires is used only at a transfer connection position between the transfer line 207 and the anode 105a of the laser, and at a transfer connection between the transfer line 207 and the first electrically conductive path 204. Therefore, the wire bonding length is minimized. Because the gold wire affects only the transmission of the high frequency signal, on the transfer board 203, only a transfer line used for transmitting the high frequency signal is disposed. In addition, as shown in FIG. 2, thickness of the transfer board may be the same as that of the first substrate. When the thickness of the transfer board is less than that of the substrate, in order to make the inner end of the transfer line on the transfer board as close as possible to the connected element, the outer end of the transfer line is closed to the connected inner end of the first electrically conductive path, and thus the wire bonding length is minimized. As shown in FIG. 2, the inner end of the transfer board may be downward sloping.

Figure 5:
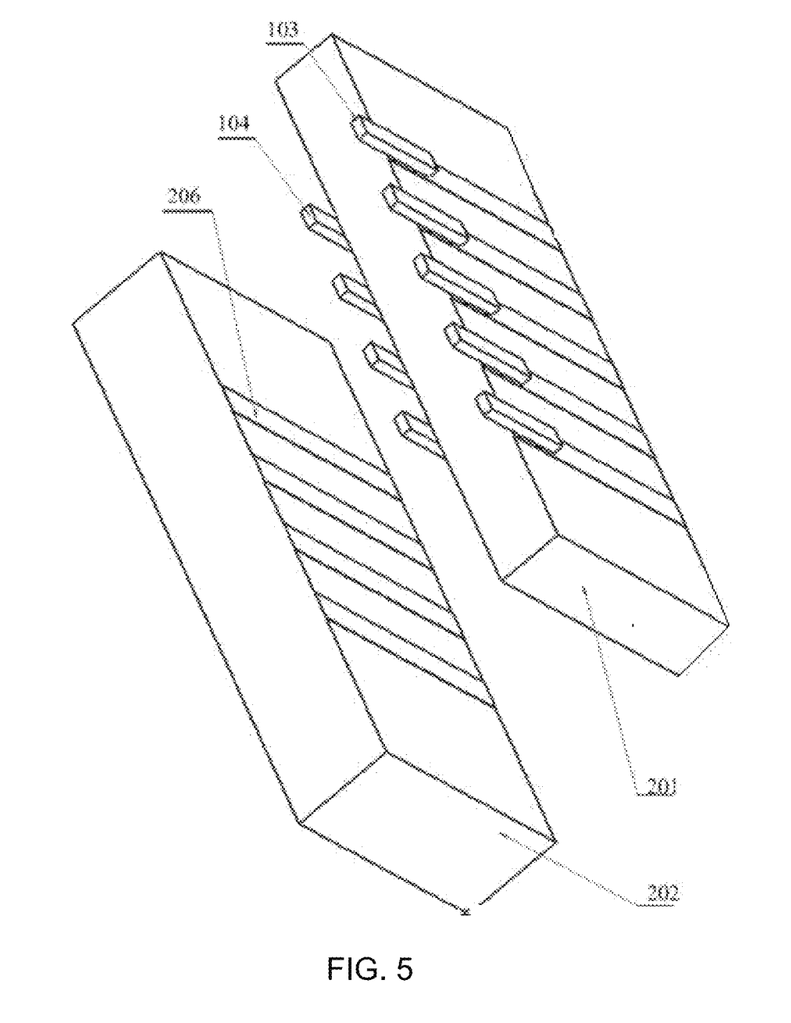
FIG. 5 is local structural diagram 3 of the optical component shown in FIG. 2 according to an embodiment of the present disclosure.

The laser includes two types: direct modulation laser and external modulation laser. For a common direct modulation laser, for example, distributed feedback laser (DFB), only a high frequency signal needs to be provided for driving the DFB; and for a common external modulation laser, for example, electro-absorption modulated laser (EML), a high frequency signal and a direct current signal need to be provided for driving the EML. A direct current signal is mainly used to supply power energy to a thermoelectric cooler, send back a thermo-sensitive resistance signal, and send back detection current of a backlight detection unit. When a normal manner is used to input a modulation signal of the laser, a signal may be used to provide a high frequency signal to the anode of the laser, and the cathode of the laser is connected to a ground cable in a common ground manner; or when a differential signal manner is used to input the modulation signal of the laser, a differential signal line of a pair of differential signal lines is used to provide a first high frequency signal to the anode of the laser, and another differential signal line of the pair of differential signal line is used to provide a second high frequency signal to the cathode of the laser. However, a high frequency signal connection needs to comply with a principle that two ground cables (G) encase one or a group of high frequency signal lines (S) to ensure impedance matching between the high frequency signal line (S) and the ground cable (G). Therefore, when a normal manner is used, common connection manners are GSG and GSGSG, and when a differential signal manner is used, the common manner is, for example, GSSG. As shown in FIG. 3 or FIG. 5, the top surface of the first substrate 201 has five first electrically conductive paths 204. When a normal manner is used, any three adjacent first electrically conductive paths 201 may be selected, wherein a middle first electrically conductive path 204 is used to connect to the high frequency signal line (S), and other two first electrically conductive paths 204 adjacent to the high frequency signal line (S) are used to connect to the ground cable (G); in addition, on the top surface of the transfer board, any three transfer lines are selected to connect to the three selected first electrically conductive paths 204 on the top surface of the first substrate 201 respectively, and of course, for the three transfer lines 207 on the top surface of the transfer board 203, a middle transfer line 207 is used to connect to the high frequency signal line (S), and other two transfer lines 207 adjacent to the high frequency signal line (S) are used to connect to the ground cable (G), and thus a GSG form is formed; or when the top surface of the first substrate 201 has five first electrically conductive paths 204 and the top surface of the transfer board 203 has five transfer lines 207, a middle electrically conductive path is used to connect to the ground cable (G), two electrically conductive paths adjacent to the ground cable (G) are used to connect to the high frequency signal line (S), and outermost two electrically conductive paths are used to connect to the ground cable (G), and thus a GSGSG-form high frequency signal connection manner is formed. When a differential signal manner is used, any four adjacent first electrically conductive paths 204 are selected, wherein a middle first electrically conductive path 204 is used to connect to a first high frequency signal line (S), another middle first electrically conductive path 204 is used to connected to a second high frequency signal line (S), and outermost two first electrically conductive paths 204 of the four adjacent first electrically conductive paths 204 are used to connect to the ground cable (G); in addition, on the top surface of the transfer board 203, any four transfer lines 207 are selected to connect to the four selected first electrically conductive paths 204 on the top surface of the first substrate 201 respectively, and of course, for the four transfer lines 207 on the top surface of the transfer board 203, two middle transfer lines 207 are used to connect to the first high frequency signal line (S) and the second high frequency signal line (S) respectively, and outermost two transfer lines 207 of the four transfer lines 207 are used to connect to the ground cable (G), and thus a GSSG-form high frequency connection manner is formed.

Figure 9:
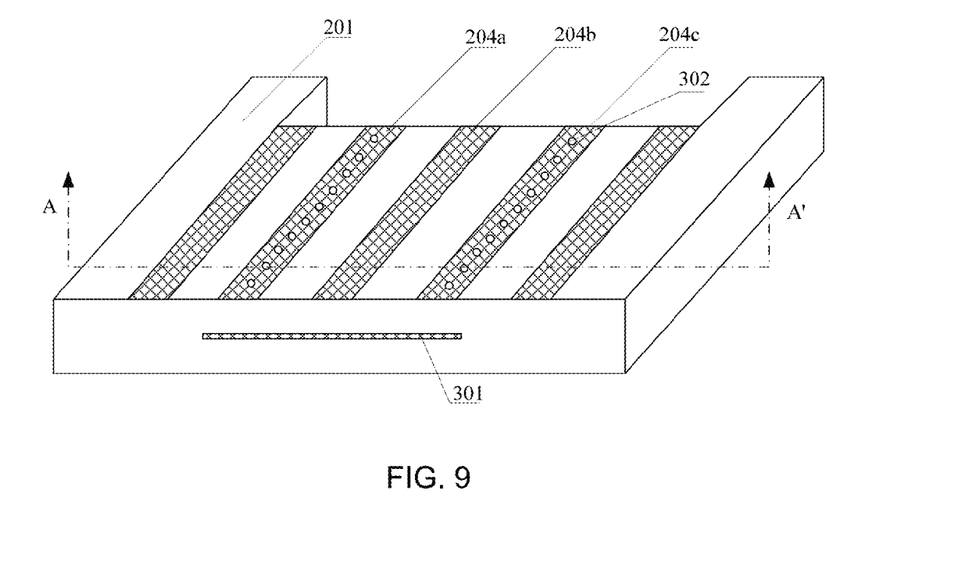
FIG. 9 is a structural diagram of a first microstrip line structure on a first substrate according to an embodiment of the present disclosure.
Figure 10:
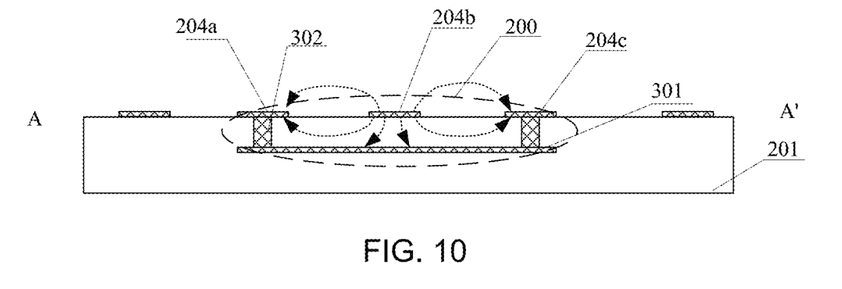
FIG. 10 is an A-A' cross-section structural diagram of the first microstrip line structure shown in FIG. 9 according to an embodiment of the present disclosure.

Further, when a normal manner is used to input a modulation signal, to prevent deterioration of a high frequency characteristic of a high frequency signal transmitted in a high frequency transmission path on the first substrate 201, the optical component according to the embodiments of the present disclosure further comprises: a first microstrip line structure 200 disposed on the first substrate. As shown in FIG. 9 and FIG. 10, the first substrate 201 is of a multiple layer structure, and the first microstrip line structure 200 includes: three adjacent first electrically conductive paths 204 (204a, 204b, and 204c) on the top surface of the first substrate 201, and a first electrically conductive layer 301 disposed inside the first substrate 201. The first electrically conductive layer 301 is electrically connected to outermost two first electrically conductive paths 204 (204a and 204c) of the three adjacent first electrically conductive paths 204 (204a, 204b, and 204c) in the first microstrip line structure 200 through a via hole 302. Optionally, a middle first electrically conductive path 204b of the three adjacent first electrically conductive paths 204 (204a, 204b, and 204c) in the first microstrip line structure 200 is connected to the anode of the laser by using a transfer line, which is used to transmit a high frequency signal of the anode of the laser; and outermost two first electrically conductive paths (204a and 204c) of the three adjacent first electrically conductive paths in the first microstrip line structure 200 are connected to the cathode of the laser by using a transfer line respectively, which is used to connect the cathode of the laser to the ground. As described above, when a high frequency signal is provided in a GSG form, the first electrically conductive path 204a, the first electrically conductive path 204c, and the first electrically conductive layer 301 are connected to the ground cable (G), and the first electrically conductive path 204b is used for the high frequency signal line (S). One side of two sides of the first electrically conductive path 204b in the first microstrip line structure is an air medium of a low dielectric constant, and another side is the first electrically conductive layer 301 of a high dielectric constant, which is more benefit to the transmission of the high frequency signal. To ensure that electric field lines of the first electrically conductive path 204b toward the first electrically conductive layer 301 are distributed densely and uniformly, multiple via holes 302 may be set uniformly to electrically connect the first electrically conductive layer 301 to the first electrically conductive paths 204a and 204c respectively.

Figure 11:
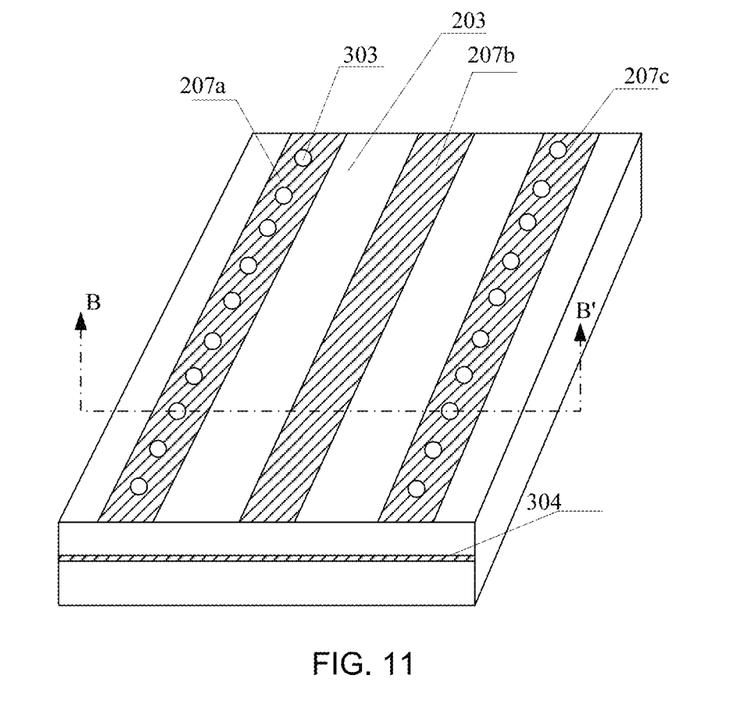
FIG. 11 is a structural diagram of a microstrip line structure on a transfer board according to an embodiment of the present disclosure.
Figure 12:
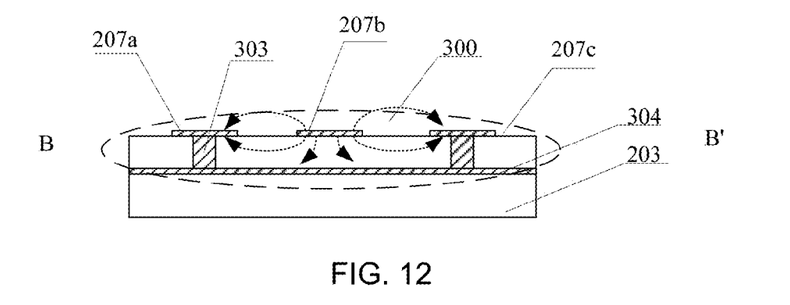
FIG. 12 is a B-B' cross-section structural diagram of the microstrip line structure on the transfer board shown in FIG. 11 according to an embodiment of the present disclosure.

Optionally, as shown in FIG. 11 and FIG. 12, based on an objective similar to the objective described above, to prevent deterioration of a high frequency characteristic of a high frequency signal transmitted in a high frequency transmission path on the transfer board 203, a microstrip line structure 300 on the transfer board 203 according to an embodiment of the present disclosure includes: three adjacent transfer lines 207 on the top surface of the transfer board 203, and a second electrically conductive layer 303 disposed inside the transfer board 203. The second electrically conductive layer 303 is electrically connected to outermost two transfer lines 207 (207a and 207c) of the three adjacent transfer lines 207 (207a, 207b, and 207c) in the microstrip line structure 300 on the transfer board 203 through a via hole 304. Optionally, a middle transfer line 207b of the three adjacent transfer lines 207 (207a, 207b, and 207c) in the first microstrip line structure 300 on the transfer board 203 is connected to an anode of a laser, which is used to transmit a high frequency signal of the anode of the laser; and outermost two transfer lines (207a and 207c) of the three adjacent transfer lines 207 (207a, 207b, and 207c) in the microstrip line structure 300 on the transfer board 203 are connected to a cathode of the laser, which is used to connect the cathode of the laser to the ground. As described above, when a high frequency signal is provided in a GSG form, the transfer line 207a, the transfer line 207c, and the second electrically conductive layer 303 are connected to the ground cable (G), and the transfer line 207b is used for the high frequency signal line (S). One side of two sides of the transfer line 207b in the second microstrip line structure is an air medium of a low dielectric constant, and another side is the third electrically conductive layer 303 of a high dielectric constant, which is more benefit to the transmission of the high frequency signal. To ensure that electric field lines of the transfer line 207b toward the second electrically conductive layer 303 are distributed densely and uniformly, multiple via holes 304 may be set uniformly to electrically connect the second electrically conductive layer 302 to the transfer lines 207b and 207c respectively.

Figure 13:
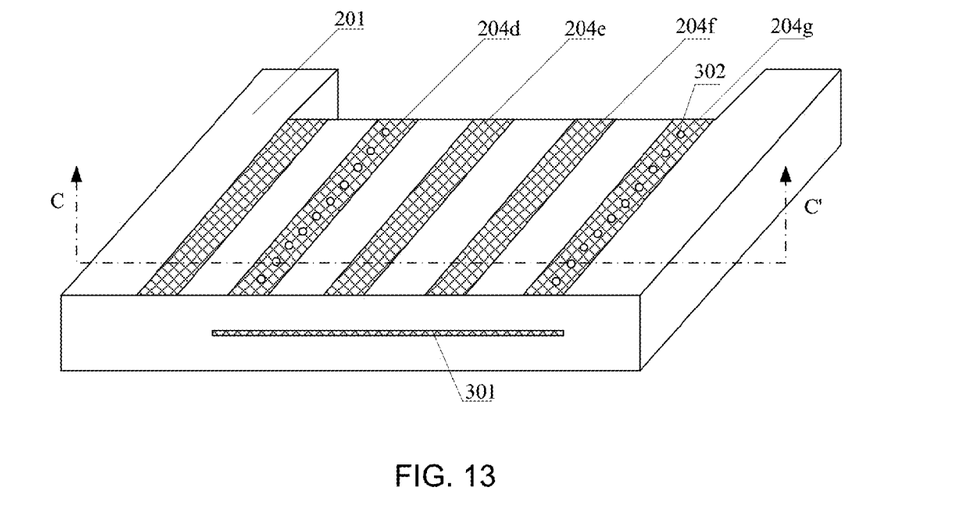
FIG. 13 is a structural diagram of a second microstrip line structure on a first substrate according to an embodiment of the present disclosure.
Figure 14:
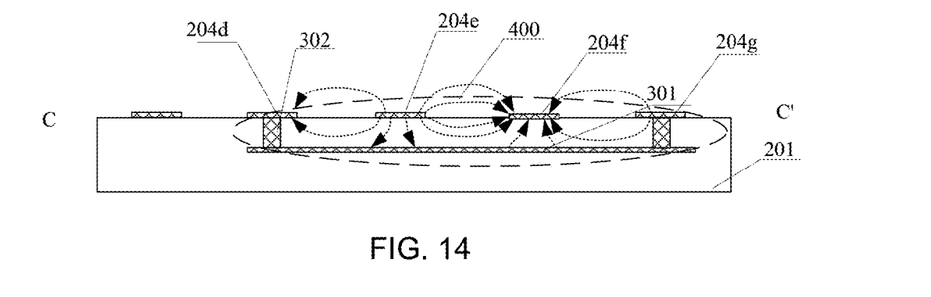
FIG. 14 is a C-C' cross-section structural diagram of the second microstrip line structure shown in FIG. 13 according to an embodiment of the present disclosure.

Further, when a differential signal manner is used to input a modulation signal, to prevent deterioration of a high frequency characteristic of a high frequency signal transmitted in a high frequency transmission path on the first substrate 201, as shown in FIG. 13 and FIG. 14, the first substrate 201 according to the embodiments of the present disclosure is of a multiple layer structure, and the substrate 201 includes a second microstrip line structure 400 thereon. The second microstrip line structure 400 includes: four adjacent first electrically conductive paths 204 (204d, 204e, 204f, and 204g) on the top surface of the first substrate 201, and a first electrically conductive layer 301 disposed inside the first substrate 201. The first electrically conductive layer 301 is electrically connected to outermost two first electrically conductive paths 204 (204d and 204g) of the four adjacent first electrically conductive paths 204 (204d, 204e, 204f, and 204g) in the second microstrip line structure 400 through a via hole 302. Optionally, a middle first electrically conductive path 204e of the four adjacent first electrically conductive path 204 (204d, 204e, 204f, and 204g) in the second microstrip line structure 400 is connected to an anode of a laser by using a transfer line, which is used to transmit a first high frequency signal of the anode of the laser; another middle first electrically conductive path 204f of the four adjacent first electrically conductive paths 204 (204d, 204e, 204f, and 204g) in the second microstrip line structure 400 is connected to a cathode of the laser by using a transfer line, which is used to transmit a second high frequency signal of the cathode of the laser; and outermost two first electrically conductive paths 204d and 204g of the four adjacent first electrically conductive paths 204 (204d, 204e, 204f, and 204g) are connected to the ground. As described above, when a high frequency signal is provided in a GSSG form, the first electrically conductive path 204d, the first electrically conductive path 204g, and the first electrically conductive layer 301 are connected to the ground cable (G). The first electrically conductive path 204e and the first electrically conductive path 204f construct a differential signal transmission path. One side of two sides of the first electrically conductive path 204e and the first electrically conductive path 204f in the second microstrip line structure is an air medium of a low dielectric constant, and another side is the first electrically conductive layer 301 of a high dielectric constant, which is more benefit to the transmission of the high frequency signal. To ensure that electric field lines of the first electrically conductive path 204e and 204f toward the first electrically conductive layer 301 are distributed densely and uniformly, multiple via holes 302 may be set uniformly to electrically connect the first electrically conductive layer 301 to the first electrically conductive paths 204d and 204g respectively.

Figure 15:
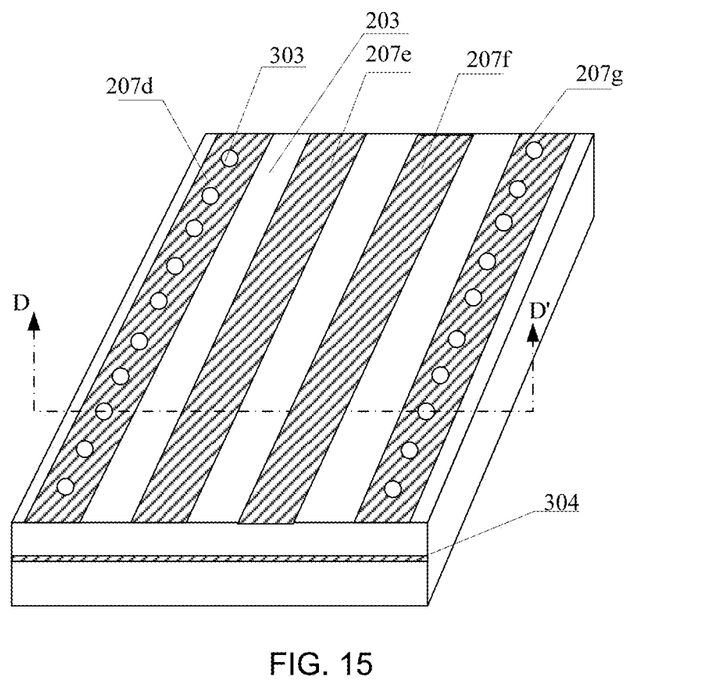
FIG. 15 is a structural diagram of a microstrip line structure on a transfer board according to another embodiment of the present disclosure.
Figure 16:
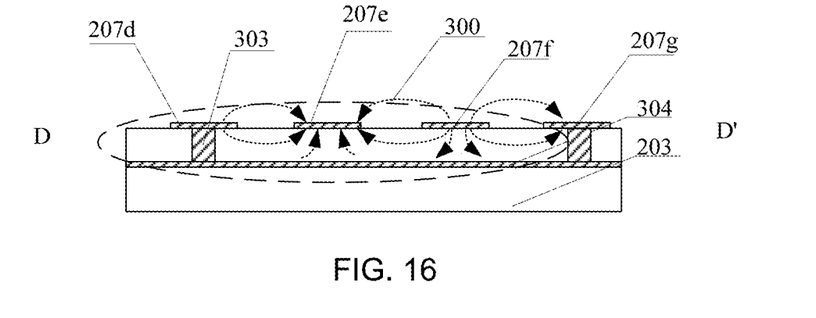
FIG. 16 is a D-D' cross-section structural diagram of the microstrip line structure on the transfer board shown in FIG. 15 according to an embodiment of the present disclosure.

Optionally, as shown in FIG. 15 and FIG. 16, based on an objective similar to the objective described above, to prevent deterioration of a high frequency characteristic of a high frequency signal transmitted in a high frequency transmission path on the transfer board 203, a microstrip line structure 300 on the transfer board 203 according to an embodiment of the present disclosure includes: four adjacent transfer lines 207 on the top surface of the transfer board 203, and a second electrically conductive layer 303 inside the transfer board 203. The second electrically conductive layer 303 is electrically connected to outermost two transfer lines 207 (207d and 207g) of the four adjacent transfer lines 207 (207d, 207e, 207f, and 207g) in the microstrip line structure 300 on the transfer board 203 through a via hole 304. Optionally, a middle transfer line 207e of the four adjacent transfer lines 207 (207d, 207e, 207f, and 207g) in the microstrip line structure 300 on the transfer board 203 is connected to an anode of a laser, which is used to transmit a first high frequency signal of the anode of the laser; and another middle transfer line 207f of the four adjacent transfer lines 207 (207d, 207e, 207f, and 207g) in the microstrip line structure 300 on the transfer board 203 is connected to a cathode of the laser, which is used to transmit a second high frequency signal of the cathode of the laser; outermost two transfer lines 207e and 207f of the four adjacent transfer lines 207 (207d, 207e, 207f, and 207g) are connected to a first electrically conductive path connected to the ground respectively. As described above, when a high frequency signal is provided in a GSSG form, the transfer line 207d, the transfer line 207g, and the second electrically conductive layer 303 are connected to the ground cable (G). The transfer line 207e and the transfer line 207f construct a differential signal transmission path. One side of two sides of the transfer line 207e and the transfer line 207f in the microstrip line structure 300 on the transfer board 203 is an air medium of a low dielectric constant, and another side is the third electrically conductive layer 303 of a high dielectric constant, which is more benefit to the transmission of the high frequency signal. To ensure that electric field lines of the transfer lines 207e and 207f toward the second electrically conductive layer 303 are distributed densely and uniformly, multiple via holes 304 may be set uniformly to electrically connect the second electrically conductive layer 302 to the transfer lines 207d and 207g respectively.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the appended claims.

It is therefore intended that the foregoing description be regarded as illustrative rather than limiting, and that it be understood that it is the following claims, including all equivalents, that are intended to define the spirit and scope of this invention.

What is claimed is:

1. An optical component, comprising:
   a first substrate, a second substrate, and a transfer board, wherein:
      a first electrically conductive path is disposed on a top surface of the first substrate, and a second electrically conductive path is disposed on a bottom surface of the first substrate;
      the first substrate comprises a first microstrip line structure comprising a first electrically conductive layer disposed inside the first substrate;
      a third electrically conductive path is disposed on a top surface of the second substrate;
      a microstrip line structure is disposed on the transfer board, wherein the microstrip line structure comprises a transfer line disposed on a top surface of the transfer board;
      the top surface of the second substrate is opposite to the bottom surface of the first substrate, wherein the second electrically conductive path fits the third electrically conductive path, and the transfer board is disposed on the top of the top surface of the second substrate; and
      one end of the transfer line is electrically connected to the first electrically conductive path by a wire bonding.

2. The optical component according to claim 1, wherein:
   the first microstrip line structure further comprises three adjacent first electrically conductive paths on the top surface of the first substrate; and
   the first electrically conductive layer is electrically connected to outermost two first electrically conductive paths of the three adjacent first electrically conductive paths in the first microstrip line structure through a via hole.

3. The optical component according to claim 2, wherein a middle first electrically conductive path of the three adjacent first electrically conductive paths in the first microstrip line structure is connected to an anode of a laser by using the transfer line; and the outermost two first electrically conductive paths of the three adjacent first electrically conductive paths in the first microstrip line structure are connected to a cathode of the laser by using the transfer line.

4. The optical component according to claim 2, wherein the microstrip line structure on the transfer board includes: three adjacent transfer lines on the top surface of the transfer board, and a second electrically conductive layer disposed inside the transfer board; and
   the second electrically conductive layer is electrically connected to two outermost transfer lines of the three adjacent transfer lines in the microstrip line structure on the transfer board through a via hole.

5. The optical component according to claim 4, wherein a middle transfer line of the three adjacent transfer lines in the microstrip line structure on the transfer board is connected to an anode of an laser; and outermost two transfer lines of the three adjacent transfer lines in the microstrip line structure on the transfer board are connected to a cathode of the laser.

6. The optical component according to claim 1, wherein the first substrate includes a notch, where projecting edges of two sides of the notch are aligned with the second substrate; and
the transfer board is at least partially disposed in the notch.

7. An optical component, comprising
a first substrate, a second substrate, and a transfer board, wherein:
a first electrically conductive path is disposed on a top surface of the first substrate, and a second electrically conductive path is disposed on a bottom surface of the first sub strate;
a third electrically conductive path is disposed on a top surface of the second substrate;
a microstrip line structure is disposed on the transfer board, wherein the microstrip line structure comprises a transfer line disposed on a top surface of the transfer board;
the top surface of the second substrate is opposite to the bottom surface of the first substrate, wherein the second electrically conductive path fits the third electrically conductive path, and the transfer board is disposed on the top of the top surface of the second substrate;
one end of the transfer line is electrically connected to the first electrically conductive path by a wire bonding;
the first substrate comprises a second microstrip line structure comprising four adjacent first electrically conductive paths on the top surface of the first substrate, and a first electrically conductive layer disposed inside the first substrate; and
the first electrically conductive layer is electrically connected to outermost two first electrically conductive paths of the four adjacent first electrically conductive paths in the second microstrip line structure through a via hole.

8. The optical component according to claim 7, wherein a middle first electrically conductive path of the four adjacent first electrically conductive paths in the second microstrip line structure is connected to an anode of a laser by using the transfer line; another middle electrically conductive path of the four adjacent first electrically conductive paths in the second microstrip line structure is connected to a cathode of the laser by using the transfer line; and the outermost two first electrically conductive paths of the four adjacent first electrically conductive paths are connected to ground.

9. The optical component according to claim 7, wherein the microstrip line structure on the transfer board includes: four adjacent transfer lines on the top surface of the transfer board, and a second electrically conductive layer disposed inside the transfer board; and
the second electrically conductive layer is electrically connected to two outermost transfer lines of the four adjacent transfer lines in the microstrip line structure through a via hole.

10. The optical component according to claim 9, wherein a middle transfer line of the four adjacent transfer lines in the microstrip line structure on the transfer board is connected to an anode of a laser; another middle transfer line of the four adjacent transfer lines in the microstrip line structure on the transfer board is connected to a cathode of the laser; and outermost two transfer lines of the four adjacent transfer lines are connected to the outmost two first electrically conductive paths connected to ground respectively.

11. An optical device, comprising:
a fiber adapter connected to an optical component, the optical component comprising: a first substrate comprising a first top surface and a first bottom surface; a second substrate comprising a second top surface and a second bottom surface, and a transfer board comprising a top transfer surface and a bottom transfer surface;
wherein a first electrically conductive path is disposed on the first top surface, and a second electrically conductive path is disposed on the first bottom surface;
wherein a first microstrip line structure is disposed on the first substrate, the first microstrip line structure comprising a first electrically conductive layer disposed inside the first substrate;
wherein a third electrically conductive path is disposed on the second top surface;
wherein a microstrip line structure is disposed on the transfer board, the microstrip line structure comprises a transfer line disposed on the top transfer surface;
wherein the second top surface is opposite to the first bottom surface;
wherein the second electrically conductive path fits the third electrically conductive path; and
wherein the transfer board is disposed on the top of the second top surface and located in the third electrically conductive path.

12. The optical device according to claim 11, wherein a first end of the transfer line is electrically connected to the first electrically conductive path by wire bonding, and a second end of the transfer line is connected to an internal element of the optical device by the wire bonding.

13. The optical device according to claim 11, wherein the first microstrip line structure further comprises three adjacent first electrically conductive paths on the first top surface of the first substrate; and
the first electrically conductive layer is electrically connected to outermost two first electrically conductive paths of the three adjacent first electrically conductive paths in the first microstrip line structure through a via hole.

14. The optical device according to claim 13, wherein a middle first electrically conductive path of the three adjacent first electrically conductive paths in the first microstrip line structure is connected to an anode of a laser by using the transfer line; and the outermost two first electrically conductive paths of the three adjacent first electrically conductive paths in the first microstrip line structure are connected to a cathode of the laser by using the transfer line.

15. The optical device according to claim 13, wherein the microstrip line structure on the transfer board includes: three adjacent transfer lines on the top transfer surface of the transfer board, and a second electrically conductive layer disposed inside the transfer board; and
the second electrically conductive layer is electrically connected to two outermost transfer lines of the three adjacent transfer lines in the microstrip line structure on the transfer board through a via hole.

16. The optical device according to claim 15, wherein a middle transfer line of the three adjacent transfer lines in the microstrip line structure on the transfer board is connected an anode of an laser; and outermost two transfer lines of the three adjacent transfer lines in the microstrip line structure on the transfer board are connected to a cathode of the laser.

17. The optical device according to claim 11, wherein
the first microstrip line structure further comprises four adjacent first electrically conductive paths on the first top surface of the first substrate; and
the first electrically conductive layer is electrically connected to outermost two first electrically conductive paths of the four adjacent first electrically conductive paths in the first microstrip line structure through a via hole.

18. The optical device according to claim 17, wherein a middle first electrically conductive path of the four adjacent first electrically conductive paths in the first microstrip line structure is connected to an anode of a laser by using the transfer line; another middle electrically conductive path of the four adjacent first electrically conductive paths in the first microstrip line structure is connected to a cathode of the laser by using the transfer line; and the outermost two first electrically conductive paths of the four adjacent first electrically conductive paths are connected to ground.

19. The optical device according to claim 17, wherein the microstrip line structure on the transfer board includes: four adjacent transfer lines on the top transfer surface of the transfer board, and a second electrically conductive layer disposed inside the transfer board; and
the second electrically conductive layer is electrically connected to outermost two transfer lines of the four adjacent transfer lines in the microstrip line structure through a via hole.

20. The optical device according to claim 19, wherein a middle transfer line of the four adjacent transfer lines in the microstrip line structure on the transfer board is connected to an anode of a laser; another middle transfer line of the four adjacent transfer lines in the microstrip line structure on the transfer board is connected to a cathode of the laser; and the outermost two transfer lines of the four adjacent transfer lines are connected to the outermost two first electrically conductive paths connected to ground respectively.

* * * * *